United States Patent [19]

Burke

[11] Patent Number: 5,008,758

[45] Date of Patent: Apr. 16, 1991

[54] SUPPRESSING DARK CURRENT IN CHARGE-COUPLED DEVICES

[75] Inventor: Barry E. Burke, Lexington, Mass.

[73] Assignee: Massachusetts Institute of Technology, Cambridge, Mass.

[21] Appl. No.: 356,778

[22] Filed: May 24, 1989

[51] Int. Cl.$^5$ .............................................. H04N 3/14
[52] U.S. Cl. ..................... 358/213.16; 358/213.31
[58] Field of Search ................... 358/213.16, 213.19, 358/213.31, 213.15; 357/24 LR

[56] References Cited

U.S. PATENT DOCUMENTS

| | | | |
|---|---|---|---|
| 3,934,161 | 1/1976 | Caywood | 358/213.19 |
| 3,953,733 | 4/1976 | Levine | 250/330 |
| 4,142,213 | 2/1979 | Glenn | 358/221 |
| 4,173,772 | 11/1979 | White | 358/213.16 |
| 4,412,343 | 10/1983 | Kosonocky | 377/58 |
| 4,496,982 | 1/1985 | Levine | 358/221 |
| 4,498,105 | 2/1985 | Crawshaw | 358/213.16 |
| 4,507,684 | 3/1985 | Battson | 358/213.18 |
| 4,525,743 | 6/1985 | Wood, Jr. et al. | 358/213.16 |
| 4,528,596 | 7/1985 | Cope | 358/213.16 |
| 4,551,762 | 11/1985 | Levine | 358/221 |
| 4,562,473 | 12/1985 | Levine | 358/213 |
| 4,567,525 | 1/1986 | Endo et al. | 358/213.17 |
| 4,580,168 | 4/1986 | Levine | 358/213.16 |
| 4,635,126 | 1/1987 | Kinoshita | 358/228 |
| 4,654,865 | 3/1987 | Sunazuka et al. | 377/62 |
| 4,675,847 | 6/1987 | Birnbaum et al. | 365/183 |
| 4,684,993 | 8/1987 | Berger et al. | 358/213.31 |
| 4,700,085 | 10/1987 | Miwada | 568/374 |
| 4,731,656 | 3/1988 | Dischert et al. | 358/213.25 |
| 4,748,895 | 7/1988 | Elabd | 91/197 |
| 4,782,394 | 11/1988 | Hieda et al. | 358/213.16 |
| 4,821,105 | 4/1989 | Suga et al. | 358/213.31 |
| 4,845,566 | 7/1989 | Sakai et al. | 358/213.31 |

FOREIGN PATENT DOCUMENTS

| | | |
|---|---|---|
| 236621A1 | 7/1979 | Fed. Rep. of Germany . |
| 58-161367 | 9/1983 | Japan . |
| 59-5787 | 1/1984 | Japan . |
| 61-104660 | 5/1986 | Japan . |
| 63-177664 | 7/1988 | Japan . |
| 63-177667 | 7/1988 | Japan . |
| 63-260070 | 10/1988 | Japan . |

OTHER PUBLICATIONS

Sequin, Carlo H., and Michael F. Tompsett., "Charge Transfer Devices", Academic Press, Inc., N.Y., Bell Telephone Laboratories, 1975, pp. 131–137.

Saks, N. S., "A Technique for Suppressing Dark Current Generated by Interface States in Buried Channel CCD Imagers", *IEEE Electron Device Letters*, vol. ED-L-1, No. 7, Jul. 1980, pp. 131–133.

Janesick et al., "Fano-Noise-Limited CCDs"; Pre-print, SPIE, Optical and Optoelectronic Applied Science and Engineering Symposium, *X-Ray Instrumentation in Astronomy*, San Diego, Aug. 14–19 (1988), pp. 1–26.

Primary Examiner—Stephen Brinich
Attorney, Agent, or Firm—Robert F. O'Connell

[57] ABSTRACT

A method for suppressing dark current in multi-phase CCD pixels of a CCD imaging device by transferring a charge packet at a first phase thereof at which surface depletion has occurred to a second phase thereof, while providing an inversion at the surface of the first phase. The transfer and inversion operations are performed before a dark current begins to be generated at the first phase. The charge packet at the second phase is then re-transferred back to the first phase and a surface inversion is produced at the second phase before a dark current begins to be generated at the second phase. Such transfer and inversion operations are repeated a number of times during the integration period of the imaging device so as to prevent dark current from being generated at any phase of the pixel.

15 Claims, 2 Drawing Sheets

SUPPRESSING DARK CURRENT IN CHARGE-COUPLED DEVICES

The Government has rights in this invention pursuant to contract No. F19628-85-C-0002 awarded by the Department of the Air Force.

INTRODUCTION

This invention relates generally to charge-coupled devices (CCD's) and, more particularly, to a novel technique for suppressing dark currents therein, particularly when used in CCD imaging systems.

BACKGROUND OF THE INVENTION

Charge-coupled devices have long been known for use in various systems, one use, for example, being in imaging systems wherein each cell of a CCD represents a pixel, or picture element, of an image, a two dimensional array of pixels or cells thereby forming the overall image. Such an imaging system using CCD devices has been described, for example, in the text, "Charge Transfer Devices," Sequin and Tompsett, Academic Press, Inc., N.Y., 1975, Chapter V.

All MIS devices, including CCD 27 devices, have surface states at the semiconductor/insulator interface thereof. One of the principal undesired effects of surface states in a CCD device, particularly a CCD imager, is that they spontaneously generate a current, called a dark current, which in turn adds an undesirable background signal, as well as undesirable noise fluctuations, in the output of the device. To avoid such unwanted dark current effects, it is desirable to devise an effective technique for eliminating or substantially suppressing the dark currents which arise therein.

The article "A Technique for Suppressing Dark Current Generated by Interface States in Buried Channel CCD Imagers," by N. S. Saks. IEEE Electron Device Letters, Vol. EDL-1, No. 7, July, 1980, pp. 131-133, describes the causes of surface state dark current generation and proposes a particular technique for suppression thereof. In accordance therewith, the gates of a multi-phase buried channel CCD pixel imaging device, having a p-type substrate and an n-type buried channel, are maintained at a bias level that is sufficiently negative to cause a charge inversion at the surface interface regions thereof. Under such inversion conditions, the high hole concentration which results at the interface region suppresses the spontaneous generation of electrons (i.e., dark current generation) by the surface states. However, when such devices have a conventional construction for use as imagers, they cannot store charge if all the gates are kept at the required inversion bias potential. At least one gate must be kept at a high potential in order to collect the photo-generated charge which forms the pixel image. In such a conventionally constructed three-phase CCD imager, for example, the gate which is maintained at the required high potential will still exhibit full surface-state dark current generation and, in effect, only ⅔ of the surface-state generated dark current can be suppressed. Alternatively, as Saks suggests, the structure of the device can be changed as to form a thicker oxide layer at one or more phase regions, the effect of which is to provide a deeper charge well thereat for collecting the photo-generated charges, while still permitting an inversion bias potential to be maintained at such regions. Such an approach, however, may involve extra fabrication steps or fabrication steps having undesirable side effects and also may tend to reduce the charge handling capacity of the device.

Another technique for suppressing dark current is described in the article, "Fano-noise-limited CCD's" by J. Janesick et al., SPIE Proceedings: X-Ray Instrumentation in Astronomy, Vol. 982, August, 1988, pp. 70-95. In accordance therewith, all of the surface interface regions of a multi-phase CCD imager are inverted while a potential well for the collection of charge is maintained in one region. The technique described therein, often referred to as a multi-pinned phase (MPP) approach, requires that an appropriate dopant be implanted at one or more phase regions of the multi-phase CCD to create a relatively deep charge well within the CCD buried channel at each implanted phase region which well can be used for charge collection. Such technique also requires extra fabrication steps and, hence, extra costs of construction when compared with the fabrication of conventional CCD structures. Moreover, such technique also may tend to reduce the charge handling capacity of the device.

It is desirable to devise a technique for suppressing dark current generation which permits substantially all of the dark current of a conventionally constructed multi-phase CCD device to be suppressed without unduly increasing the cost or complexity of fabrication of the device and without reducing the charge handling capacity of the device during use.

BRIEF SUMMARY OF THE INVENTION

In accordance with the invention, a technique has been devised for suppressing surface state dark current in a multi-phase CCD device by providing a relatively simple change in the timing used in clocking voltage potentials at the gates of the pixels thereof during the operation of a conventionally fabricated CCD device. Normally, during the integration period, i.e., the time period when the imaging photon charges are being collected at a collection phase region of each pixel of the device, (e.g. normally one display frame period of 1/60 second), the voltage potential at the gate at such collection region, e.g., phase 2 of a 3-phase pixel, is held at a high level while the potentials at the gates of the remaining phases, e.g., phases 1 and 3, are held at sufficiently low levels that the surfaces at phases 1 and 3 are inverted. The surface at phase 2, where the charge packet is collected, is depleted, a condition which causes a dark current to begin to be generated after a finite time period following the surface depletion process.

In accordance with the invention, before such dark current can begin to be generated, the charge packet is transferred from the high potential collection phase 2 to one of the other phases, e.g phase 3. The surface at the original collection phase 2 is inverted by clocking a suitable low potential thereto, thereby preventing the generation of dark current therein and the surface at phase 3 to which the charge packet has been transferred has a high potential clocked thereto to effect the charge packet transfer. The charge packet transfer from the original collection phase and the surface inversion at phase 2 takes place at a time which is well before the finite time at which a dark current will begin to be generated in such phase. The charge packet transfer can be achieved in a few microseconds, i.e., a time period also much less than the finite time during which a surface dark current would begin to be generated following the original surface depletion at phase 2. The high level potential at phase 3 causes the latter surface to become depleted.

The charge packet then in the phase 3 region to which it has been transferred is then re-transferred back to the original collection phase 2 region by clocking a high potential to phase 2, again at a time which is well before the finite time at which dark current can begin to be generated at phase 3. A low potential is clocked to phase 3 to invert its surface to prevent surface dark current generation thereat. The charge packet can then continue to be transferred back and forth and the high and low potentials applied between the two phase regions during the integration time period, i.e., the video frame period, so that dark current never begins to be generated in either of the two phase regions involved and surface dark current in the overall device is thereby substantially fully suppressed. At the end of the video frame period, the charge packet is available for readout.

DESCRIPTION OF THE INVENTION

The invention can be described in more detail with the help of the accompanying drawings wherein FIG. 1 shows a simplified diagrammatic side view of a typical three-phase CCD device which drawing is helpful in explaining the dark current problem;

Figure 1:
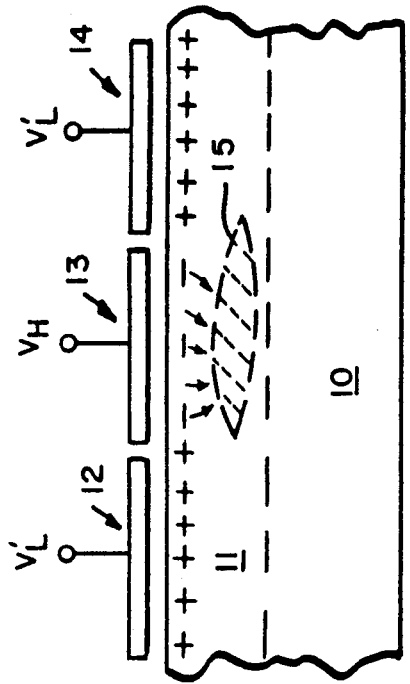

As can be seen in FIG. 1, a conventional buried-channel CCD device for generating one pixel of a plurality of pixels in an array thereof as used in an imaging device includes a silicon substrate region 10, normally of a p-type material, having an n-type buried channel region 11 therein. It should be understood, however, that the principles discussed herein will apply equally well to devices in which the substrate is an n-type material and the buried channel is a p-type channel. In a three-phase pixel, three gates, 12, 13, 14 are used to apply suitable potentials to the three phase regions thereof. Typical potentials applied to each of the gates thereof are represented by low potentials $V_L$ applied to the phases 1 and 3 (at gates 12 and 14) and a high potential $V_H$ applied to phase 2 (at gate 13). When $V_L$ is at a level which is greater than a voltage $V_{INV}$ which will produce a charge inversion at the surface interface of region 11, the surface under all the gates is depleted and charge is collected in a charge packet 15 which is formed under gate 13, for example. Under such conditions, in the particular device shown, electrons are spontaneously generated from the silicon material at surface states, which electrons as a result of thermal energy produce a full surface-state dark current at all phase regions (shown by the arrows).

Figure 2:
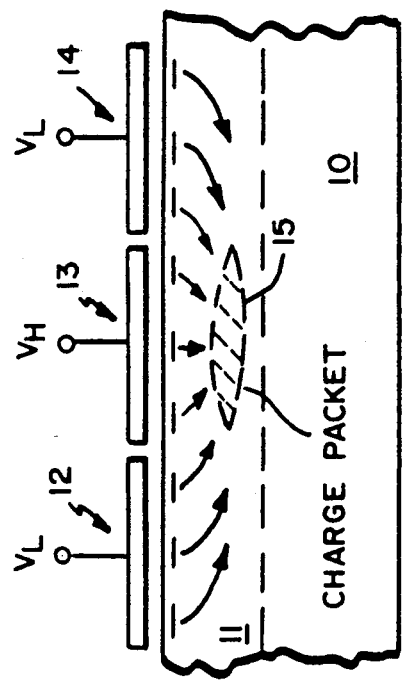
FIG. 2 shows a diagrammatic side view of the device of FIG. 1 illustrating an approach used by the prior art in providing partial suppression of dark current.

As discussed above, in order to suppress such dark current, two of three phases can be held at a low potential $V_L'$, i.e., at a potential such that $V_L'$ is less than $V_{INV}$ so as to produce charge inversion (i.e., a surplus of holes) at the surface, as shown. In the example depicted in FIG. 2, such inversion is produced at phases 1 and 3 beneath gates 12 and 14 and the holes combine with the spontaneously generated electrons at surface states in effect to empty such regions of electrons before they are liberated and can flow to charge packet 15, while surface depletion occurs at phase 2 beneath gate 13 where charge packet 15 is collected. Accordingly, by emptying the surface region of electrons beneath gates 12 and 14, dark current suppression occurs at phases 1 and 3, but the region beneath gate 13 is not emptied of electrons and dark current is not suppressed at phase 2. Such a technique is described, for example, in the aforesaid Saks article.

Figure 3:
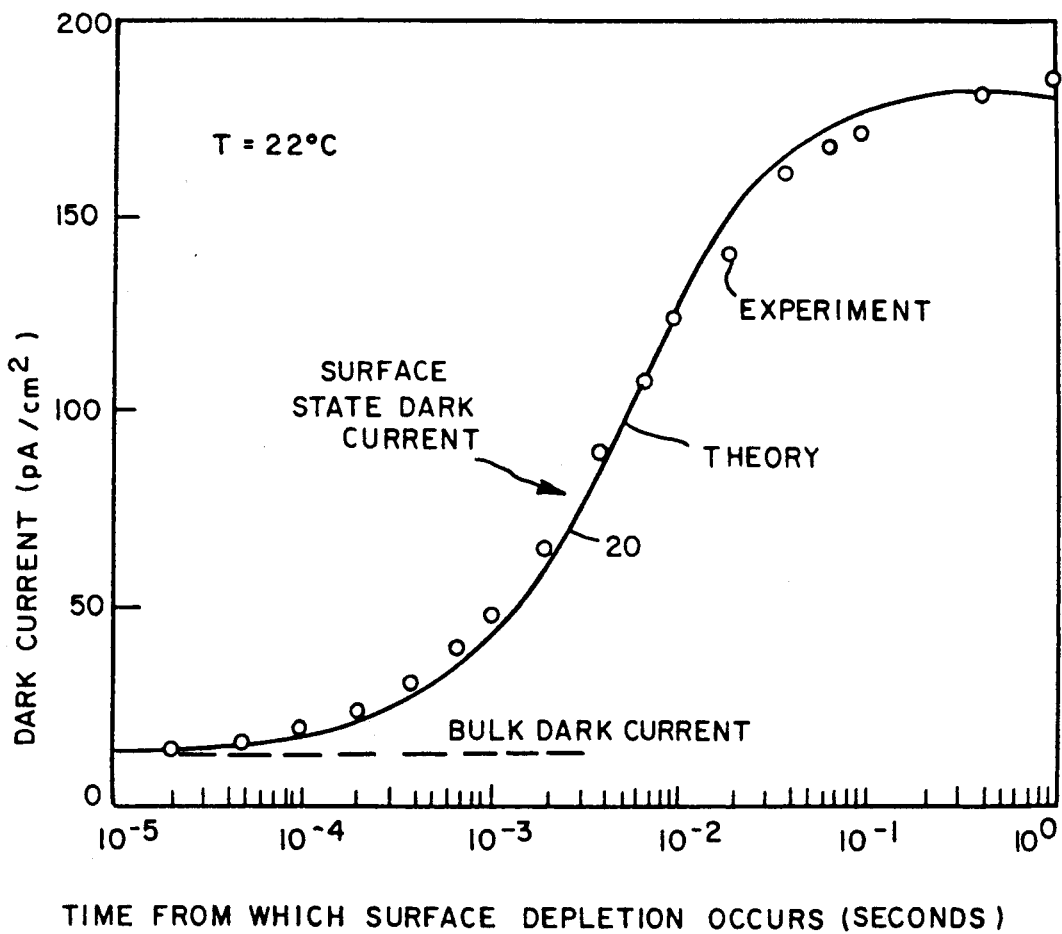
FIG. 3 shows a graph of dark current generated as a function of time in a depleted surface state region of a device of FIG. 1.

FIG. 3 shows a graph of dark current generation as a function of time which occurs when a surface becomes depleted. As can be seen therein, dark current is effectively generated due to both surface depletion and to bulk region characteristics The average bulk dark current level of many exemplary CCD devices tends to be somewhat relatively constant and at a relatively low level and is shown in the graph for such exemplary devices as typically about 20 pA/cm$^2$, or less, for example. Such average bulk dark current level is often sufficiently small that it produces little or no adverse effects on CCD operation, insofar as undesired background or noise levels are concerned.

Curve 20 of FIG. 3 also shows how surface state dark current theoretically builds up with time, experimental verification of the theoretical curve for an exemplary device having been measured as depicted by the white circles in the graph. As can be seen by the experimental results, at a temperature of 22° C., surface state dark current begins to be generated at a finite time following surface depletion, i.e., at a little more than 10 microseconds ($\mu$ sec.), i e., $10^{-5}$ seconds, thereafter and does not begin to rise to any significant level until about 100 $\mu$ sec. ($10^{-4}$ seconds) thereafter. Dark current build up is thereupon relatively rapid and tends to level off at or before about one second after surface depletion occurs at a typical current level of about 180 pA/cm$^2$ or so. It is desirable to suppress the generation of such high level dark current in all phases of a CCD device.

Figure 4:
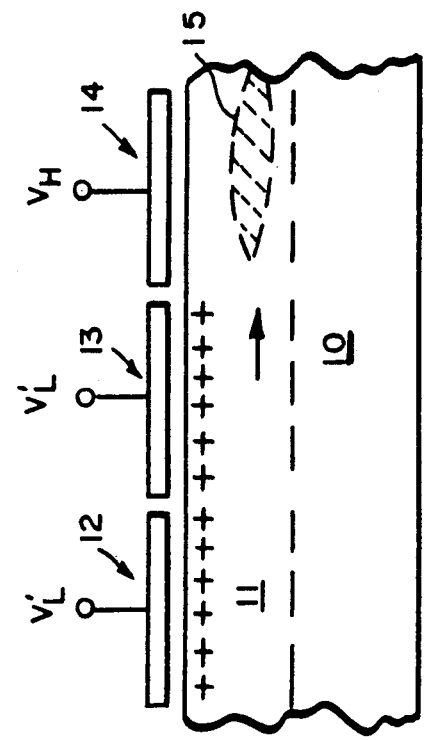
FIGS. 4 and 4A show diagrammatic side views of a device of FIG. 1 at two different times operating in accordance with the technique of the invention.
Figure 4A:
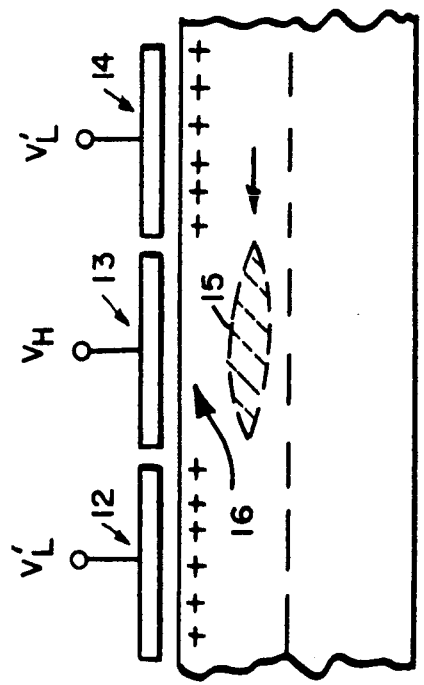

The technique of the invention for doing so can be explained with the help of FIG. 3 as well as FIGS. 4 and 4A. As can be seen in FIG. 4, a three-phase CCD pixel during operation as an imager, for example, has a charge packet 15 formed at a surface depletion region, e.g., region 16 under gate 13 (at phase 2) to which a potential $V_H$ is applied by being clocked to gate 13. The potentials clocked at gates 12 and 14 (phases 1 and 3) are each at a low level $V_L'$ which is less than $V_{INV}$ so that inversion occurs at the interface surfaces of such phases as shown.

Before dark current can begin to be generated after the surface region 16 at phase 2 has become depleted, e.g., before a time which is less than about 10 $\mu$ sec. from the time such surface becomes depleted, as seen in FIG. 3, the potentials at the gate 13 and 14 are appropriately clocked so that a high potential $V_H$ is applied to gate 14 at phase 3, for example, and a low potential $V_L'$ (below $V_{INV}$) is applied to gate 13 at phase 2, phase 1 remaining at $V_L'$. When $V_H$ is clocked to gate 14, the charge packet 15 is thereby transferred from phase 2 to phase 3, as shown in FIG. 4A. When $V_L'$ is clocked to gate 13, the surface at phase 2 is inverted, thereby preventing the generation of surface dark current at phase 2. The surface at phase 3 is depleted.

Surface depletion at phase 3 normally would cause dark current to begin to be generated within about 10 $\mu$ sec. as seen from FIG. 3. Accordingly, to prevent such dark current generation at phase 3, the potentials are then subsequently clocked, before a 10 $\mu$ sec. time period has occurred after the surface depletion of phase 3, in a manner such that $V_H$ is clocked to gate 13 and $V_L'$ is clocked to gate 14, the charge packet 15 being thereupon re-transferred back to phase 2 from phase 3, as shown in FIG. 4. Such re-transfer occurs before dark current has a chance to be generated at phase 3 and the re-inversion of phase 3 prevents dark current generation at phase 3. Such transfers of the charge packet between phase 2 and phase 3 and the surface inversions thereat can be repeated periodically in accordance with an appropriate voltage clocking rate of the potentials at gates 13 and 14 so that the charge packet continues to move back and forth periodically between phases 2 and 3 and in each case dark current is prevented from being generated at the surface depleted regions involved. The pixel information represented by the charge packet is ultimately available for readout at the end of the integration period to permit display of the particular pixel information involved in the overall picture image. Each pixel device of an array thereof can be handled in the same manner in terms of the clocking of its gates for such dark current suppression purpose.

Thus, the surface state dark current never has an opportunity to be built up in any phase of a multi-phase pixel, while the charge packet is available at any point in time for readout at the phase where the surface is temporarily depleted in the clocking process. The surface state dark current of the device is thereby effectively fully suppressed at all phases thereof at all times so that adverse background and noise effects are not produced. Moreover as mentioned above, the substantially constant average bulk dark current in many exemplary devices is sufficiently low that no adverse effect arises because of its presence.

While in the specific embodiment described with reference to FIGS. 4 and 4A, the voltages are clocked and the charge packet is transferred between phase 2 and phase 3 of a 3-phase CCD pixel, the voltage clocking and charge packet transfer can also alternatively occur between phase 2 and phase 1 in the same manner or it can further be arranged to alternate the voltage clocking and charge packet transfer among all three phases, e.g., from phase 2, to phase 3, back to phase 2, to phase 1, back to phase 2, and so on.

In a demonstration of a practical embodiment of a CCD imaging system using an array of 420×420 pixels operated at room temperature, for example, charge was collected in the phase 2 regions of each pixel and periodically transferred to the phase 3 regions thereof and thereupon back to the phase 2 regions using a transfer time of 3 μ sec. So long as the transfer occurred at a time which was less than 100 μ sec., and preferably less than 10 μ sec. from the time at which the surface of a phase region became depleted, surface dark current was essentially entirely suppressed at such region. Further, it was found that, as the temperature is reduced below room temperature, the time between transfers needed to suppress the surface state dark current can be increased, as such dark current does not begin its build up following surface depletion as quickly at lower temperatures (curve 20 of FIG. 3 in effect shifts to the right at lower temperatures).

The above described embodiments of the invention are exemplary only and modifications thereto may occur to those in the art within the spirit and scope of the invention. Hence, the invention is not to be construed as limited only to the specific embodiments discussed herein, except as defined by the appended claims.

What is claimed is:

1. A method for suppressing dark current in a first region of an MIS device, said first region having a charge packet therein, further non-liberated charges of one polarity spontaneously arising in said first region, said method comprising the steps of
   (1) transferring said charge packet from said first region to a second region of said device; and
   (2) supplying charges of a polarity opposite to said one polarity to said first region, said opposite polarity charges combining with said further non-liberated charges to prevent the liberation thereof into said charge pocket so as to prevent the generation of dark current in said first region.

2. A method in accordance with claim 1 wherein said MIS device is a charge-coupled device.

3. A method in accordance with claim 2 wherein said charge-coupled device comprises a p-type substrate and an n-type buried channel, said further non-liberated charges arising in said first region being electrons and said opposite polarity charges being holes.

4. A method in accordance with claim 2 wherein said charge-coupled device comprises an n-type substrate and a p-type buried channel, said further non-liberated charges arising in said first region being holes and said opposite polarity charges being electrons.

5. A method for suppressing dark current in a first region of a charge-coupled device having a charge packet therein, further non-liberated charges of one polarity spontaneously arising therein, said method comprising the steps of
   (1) applying a first potential to a second region of said device to transfer said charge packet from said first region to said second region, said first potential being applied before said non-liberated charges are liberated and dark current begins to be generated in said first region; and
   (2) applying a second potential to said first region of said device for producing surface inversions at said first region to prevent the liberation of said non-liberated charges therein, whereby dark current is prevented from being generated in said first region.

6. A method in accordance with claim 5 wherein said charge-coupled device is a multi-phase device and said first region is at one phase thereof and said second region is at another phase thereof wherein
   in step (1) said first potential is applied to said second phase to produce a surface depletion at said second phase and to cause said charge packet to be transferred from said first phase to said second phase; and
   in step (2) said second potential is applied to said first phase to produce said surface inversion.

7. A method in accordance with claim 6 and further including the steps of
   (3) applying said first potential to said first phase of said device to transfer the charge packet from said second phase back to said first phase before dark current can begin to be generated at said second phase and to produce a surface depletion at first phase; and
   (4) applying said second potential to said second phase to produce surface inversion at said second phase to prevent dark current generation in said second phase.

8. A method in accordance with claim 7 wherein steps (1), (2), (3) and (4) are repeated a selected number of times.

9. A method in accordance with claim 8 wherein said charge-coupled device is a three-phase device wherein said first phase is phase 2 thereof and said second phase is phase 1 or phase 3 thereof.

10. A method in accordance with claim 7 wherein said charge coupled device is a three-phase device and said first phase is phase 2 thereof and said second phase is phase 3 thereof and further including the steps of (5) applying said first potential to phase 1 of said device to transfer the charge packet from phase 2 to phase 1 before dark current begins to be generated at phase 2 and to produce a surface depletion at phase 1;

(6) applying said second potential to phase 2 to produce surface inversion to prevent dark current generation thereat at phase 2;

(7) applying said first potential to phase 2 to transfer the charge packet from phase 1 back to phase 2 before dark current begins to be generated at phase 1 and to produce a surface depletion at phase 2; and (8) applying said second potential to phase 1 to produce surface inversion at phase 1 to prevent dark current generation thereat.

11. A method in accordance with claim 10 wherein steps (1) through (8) are repeated a selected number of times.

12. A charge-coupled device comprising a plurality of pixels, each having a plurality of phases, a charge packet produced at a first phase thereof and further non-liberated charges of one polarity spontaneously arising in said first, said system including clocking means for applying a selected first potential to a second phase of said device so as to transfer the charge packet from said first phase to said second phase before dark current can begin to be generated in said first phase and to produce a surface depletion at said second phase and for applying a selected second potential to said first phase to produce a surface inversion to prevent liberation of said non-liberated charges so as to prevent dark current generation at said first phase;

said clocking means subsequently applying said selected first potential to said first phase before dark current can begin to be generated in said second phase to transfer said charge packet from said second phase back to said first phase and to produce surface depletion at said first phase and applying said selected second potential to said second phase to produce a surface inversion to prevent the liberation of non-liberated charges in said second phase so as to prevent dark current generation at said second phase.

13. A device in accordance with claim 12 wherein said clocking means operates so as to apply said selected potentials to said first and second phases periodically for a specified number of clocking periods.

14. A device in accordance with claim 13 wherein said charge coupled device is a three-phase device having a p-type substrate and an n-type buried channel, said further non-liberated charges of one polarity being electrons and the producing of said surface inversion thereby supplying holes for combining with said electrons to prevent the generation of dark current.

15. A device in accordance with claim 13 wherein said charge-coupled device is a three-phase device having an n-type substrate and a p-type buried channel, said further non-liberated charges of one polarity being holes and the producing of said surface inversion thereby supplying electrons for combining with said holes to prevent the generation of dark current.

* * * * *